United States Patent [19]

Bachler

[11] Patent Number: 5,147,208
[45] Date of Patent: Sep. 15, 1992

[54] FLEXIBLE PRINTED CIRCUIT WITH RAISED CONTACTS

[75] Inventor: Gary A. Bachler, Mesa, Ariz.
[73] Assignee: Rogers Corporation, Rogers, Conn.
[21] Appl. No.: 722,957
[22] Filed: Jun. 28, 1991
[51] Int. Cl.⁵ .............................................. H01R 9/09
[52] U.S. Cl. ....................................... 439/67; 439/77; 439/493; 29/846
[58] Field of Search ............... 439/67, 74, 77, 492, 439/493; 29/831, 842, 844, 846, 848, 876, 883, 884

[56] References Cited

U.S. PATENT DOCUMENTS 4,548,451 10/1985 Benarr et al. .......................... 29/848
5,095,628 3/1992 McKenney et al. ................... 439/67

Primary Examiner—Paula A. Bradley
Attorney, Agent, or Firm—Fishman, Dionne & Cantor

[57] ABSTRACT

A flexible printed circuit with raised contacts is presented. In accordance with this invention, a flexible circuit is disposed on a substrate. The substrate includes a pattern comprised of a plurality of raised features. Similarly, the flexible circuit has a corresponding pattern comprised of a plurality of contact pads. The contact pads are disposed on the raised features to form the raised contacts. The raised contacts perfect registration between the contact pads and the contact surfaces of a mating electrical component (e.g., a surface mount integrated circuit) when a pressure connection system is employed.

22 Claims, 1 Drawing Sheet

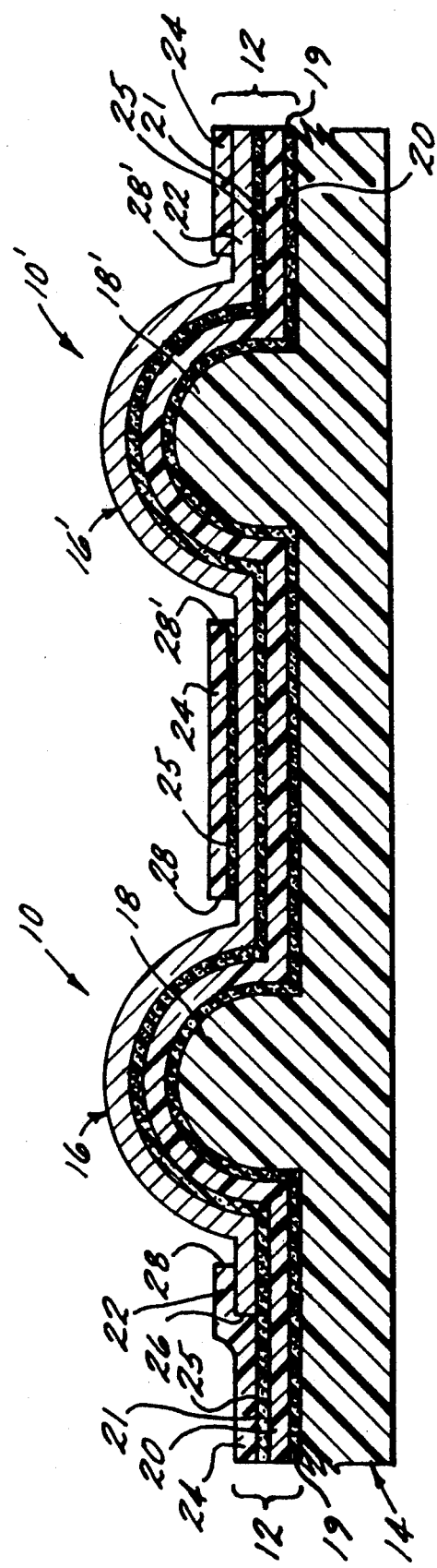

FLEXIBLE PRINTED CIRCUIT WITH RAISED CONTACTS

BACKGROUND OF THE INVENTION

This invention relates generally to flexible printed circuits and, more particularly to flexible printed circuits with raised contacts.

It is well known in the art to use raised contact elements (sometimes referred to as "bumps") to make contact for electrical interconnection. Such bump contacts are frequently used on interconnect devices or circuitry that is used to connect a circuit to an electronic component (for example an integrated circuit or IC) or to another circuit. By way of example, it is known to use bump contacts to connect one circuit component to another, often by the use of a pressure connection system such as shown, e.g., in U.S. Pat. Nos. 4,468,074, 4,610,495, and 4,768,971 (which are assigned to the assignee hereof and fully incorporated herein by reference). For example, it is known to use contact bumps on flexible circuitry to connect two circuit boards via a pressure connection. In such a pressure connection system, electrical connection between the raised contact patterns of the circuit and the contact surfaces an IC is generally made by pressing the contact surfaces of the IC against the contact pads of the circuit. Reliability of this electrical interconnection is increased by use of the raised contacts. Raised contacts of the type described herein have been manufactured by either electroplating metal onto the pad surface or by deforming the substrate below the pad surface with a male/female tool. An example of an electroplating scheme for the formation of co-planar bumps is disclosed in U.S. patent application Ser. No. 601,904 filed Oct. 23, 1990 (now U.S. Pat. No. 5,072,520). When a male/female tool is used, gaps are often formed in the substrate which are then filled with an epoxy to prevent the raised contact pads from collapsing. In either case, control of the coplanarity of the raised feature is very important. The coplanarity of the raised feature must be maintained while under contact pressure. The raised pad surface is often deformed when the pressure connection system is applied. When the raised pad surface is deformed, registration between the pads and the contact surface of the IC or other device is degraded. Thus, a need exists for a flexible circuit which has raised contact pad features that will maintain registration between the contact pads on the circuit and the contact surfaces of the IC or other device when the pressure connection system is applied.

This uniformity of contact height is especially important when the density of bump contact increases and the bumps come closer together. In such cases the flexibility of the interconnect circuit material may not provide the needed compensation to overcome differences in bump height, and malfunctions will occur because of failure to make contact where required.

When bump contacts are used in a high density contact applications, such as multichip module (MCM) to circuit board connections (e.g., pitch (center to center of adjacent contact sites) under 50 mils), it is extremely important that coplanarity of the bump contact surfaces be maintained. That is, the height of the bumps must be carefully controlled so that the top or contact surfaces of all of the bumps will be in the same plane in order to make contact with the contact points on the MCM or other device to be contacted. If the bump height differs from bump to bump, contact may not be established at all contact sites. For example, if a shorter bump is located between two higher bumps, the shorter bump may not make contact with its intended contact site on the MCM or other device, thereby resulting in a malfunction.

SUMMARY OF THE INVENTION

In accordance with the present invention, a flexible printed circuit is provided having raised contacts or bumps. The flexible printed circuit is disposed on a rigid substrate which has a plurality of raised portions or bumps thereon. The raised pads of the circuit correspond to the raised portions of the substrate so that the raised portions of the substrate support the raised contacts of the flex circuit. These supported raised contacts will not deform when a component (e.g., a surface mount integrated circuit), is electrically connected to the raised contacts via a pressure connection system. The present invention is manufactured by generating or forming the raised contacts in the flexible circuit by pressing (under heat and pressure) a preformed (typically molded) support (typically plastic) to the flex circuit. The support includes a pre-selected array of protruding bumps and is left in place to define a support substrate for the flex circuit.

The present invention eliminates the need for electroplating metal onto the pad surface of the flexible circuit or deforming the substrate below the pad surface with a male/female tool as in the prior art. The raised contacts of the present invention will not become deformed when the pressure connection system is applied to the component in connection with the raised contact so as to degrade electrical registration therebetween. Moreover, all such contacts on the printed circuit having such a connection can be raised in accordance with the present invention in order to insure uniform registration (e.g., coplanar registration) between the circuit pads and the contact surface of the mating component.

The above discussed and other features and advantages of the present invention will be appreciated and understood by those skilled in the art from the following detailed description and drawing.

BRIEF DESCRIPTION OF THE DRAWING

The sole FIGURE is a cross sectional front elevation view of a raised contact pad in accordance with the present invention.

DESCRIPTION OF THE PREFERRED EMBODIMENT

Referring now to the FIGURE, a pair of raised contact pads in accordance with the present invention are shown generally at 10 and 10'. Raised contact 10 being generally the same as raised contact 10' whereby the like elements are numbered alike include a prime. Raised contacts 10 and 10' comprise a flexible printed circuit 12 bonded onto a substrate 14. More particularly, contact 10 includes a contact pad 16 (e.g., copper) disposed on a raised portion 18 of substrate 14. Although only two raised contacts 10 and 10' are shown for purposes of illustration, it is intended that a plurality of raised contacts corresponding to the contact surfaces of mating electrical components (e.g., a surface mount integrated circuit in conjunction with a pressure connection system, such as disclosed in U.S. Pat. No. 4,468,074) be employed, thus insuring uniform registration between the component contact surfaces and the raised contacts 10.

Substrate 14 is preferably comprised of a molded electrically nonconductive plastic material (e.g., polyetherimide manufactured by the General Electric Corporation under the registered trademark ULTEM). Substrate 14 is molded to provide a generally planar surface having a pattern of raised portions 18 which match the pattern of pads 16 of circuit 12. Of course, substrate 14 may be molded to define any desire configuration or pattern of portions 18.

Flexible circuit 12 is adhesively affixed to substrate 14 by any well known and suitable adhesive 19 (e.g., lamination with a generally acrylic or epoxy adhesive). Generally, circuit 12 has a base layer 20 comprised of a polyimide film such as Kapton film bonded by a generally acrylic or epoxy adhesive 21 to a copper conductor 22. A top or cover layer 24 comprised of polyimide film is also bonded by an adhesive 25 to conductor 22 so that conductor 22 is sandwiched between layers 20 and 24. It will be appreciated the layers 20 and 24 are bonded together at regions where conductor 22 is not present. While a simple flexible circuit 12 has been described other flexible circuits may also be utilized which, for example, do not utilize adhesive to connect the copper to the polyimide and instead use direct deposition techniques such as sputtering, or have more than one layer of copper.

Circuit 12 is formed or pressed (under heat and pressure) against substrate 14 so that contact pad 16 is formed over and thereby disposed on raised portion 18 thus providing the raised contact 10 of the present invention. Contact pad 16 of circuit 12 generally follows the contour of raised portion 18. Although a curved raised portion 18 is shown, the raised land may have other forms (e.g., a flat raised portion) without departing from the spirit or scope of the present invention. Pad 16 covers an area greater than that of portion 18 to allow conductor 22 to be secured on all sides by layers 22 and 24. This is illustrated at one end 26 of conductor 22. While conductor 22 is shown terminated at pad 16, conductor 22 may also be connected to other pads of circuit 12. Pad 16 thus comprises base layer 20 bonded to conductor 22. Pad 16 is devoid of cover layer 24 to allow electrical connection between conductor 22 and a contact surface of a mating component. Layer 24 is terminated at an annular ring 28 surrounding pad 16.

In accordance with an important feature of this invention, raised contacts 10 will not become deformed when the pressure connection system is applied to the component in connection with the raised contacts 10. In accordance with the present invention, all pads 16 of circuit 12 may be raised, particularly where interconnection between the circuit 12 and an electrical component is made by asserting a force to press the contact surfaces of the component against the pads 16 (i.e., a pressure connection system).

While preferred embodiments have been shown and described, various modifications and substitutions may be made thereto without departing from the spirit and scope of the invention. Accordingly, it is to be understood that the present invention has been described by way of illustration and not limitations.

What is claimed is:

1. A raised contact pad, comprising:
    an electrically non-conductive generally planar rigid substrate having a non-deformable raised portion extending therefrom; and
    flexible circuit means having a contact pad, said flexible circuit means being disposed on said substrate with said contact pad being disposed over said non-deformable raised portion thereby defining a raised contact pad supported by said substrate.

2. The raised contact pad of claim 1 wherein said substrate comprises a molded plastic substrate.

3. The raised contact pad of claim 1 wherein said contact pad is continuous with said flexible circuit means.

4. The raised contact pad of claim 1 wherein said flexible circuit means comprises:
    a base layer deposited on said substrate;
    an electrically conductive layer deposited on said base layer; and
    a cover layer deposited on portions of said conductive layer so that at least a portion of said conductive layer is sandwiched between said base layer and said cover layer.

5. The raised contact pad of claim 4 wherein said conductive layer comprises copper.

6. The raised contact pad of claim 4 wherein said base layer and said cover layer comprises an electrically non-conductive film.

7. The raised contact pad of claim 6 wherein said electrically non-conductive film is a polyimide film.

8. A circuit board, comprising:
    an electrically non-conductive generally planar rigid substrate having a first pattern which comprises at least one non-deformable raised portion extending therefrom; and
    flexible circuit means having a second pattern which comprises at least one contact pad, said flexible circuit being disposed on said substrate with said second pattern corresponding to said first pattern thereby defining at least one raised contact pad supported by said substrate.

9. The circuit board of claim 8 wherein said substrate comprises a molded plastic substrate.

10. The circuit board of claim 8 wherein:
    said substrate includes a plurality of said raised portions; and
    said flexible circuit means includes a corresponding plurality of said contact pads.

11. The raised contact pad of claim 8 wherein said contact pad is continuous with said flexible circuit means.

12. The circuit board of claim 8 wherein said flexible circuit means comprises:
    a base layer deposited on said substrate;
    an electrically conductive layer deposited on said base layer; and
    a cover layer deposited on portions of said conductive layer so that at least a portion of said conductive layer is sandwiched between said base layer and said cover layer.

13. The circuit board of claim 12 wherein said conductive layer comprises copper.

14. The circuit board of claim 12 wherein said base layer and said cover layer comprises an electrically non-conductive film.

15. The circuit board of claim 14 wherein said electrically non-conductive film is a polyimide film.

16. A method for forming a circuit board having at least one raised contact pad thereon, comprising the steps of:

molding a substrate to provide a generally planar rigid surface having at least one non-deformable raised portion extending therefrom; and pressing a flexible circuit against said substrate so that at least one contact pad of said flexible circuit is formed over said non-deformable raised portion thereby defining at least one raised contact pad supported by said substrate.

17. The method of claim 16 wherein said pressing further comprises pressing said flexible circuit under heat and pressure.

18. The method of claim 16 wherein said substrate comprises molded plastic.

19. The method of claim 16 wherein said flexible circuit means comprises:

a base layer deposited on said substrate;

en electrically conductive layer deposited on said base layer; and a cover layer deposited on portions of said conductive layer so that at least a portion of said conductive layer is sandwiched between said base layer and said cover layer.

20. The method of claim 19 wherein said conductive layer comprises copper.

21. The method of claim 19 wherein said base layer and said cover layer comprises an electrically non-conductive film.

22. The method of claim 21 wherein said electrically non-conductive film is a polyimide film.

* * * * *